(12) United States Patent
Shirahama et al.

(10) Patent No.: US 7,535,748 B2
(45) Date of Patent: May 19, 2009

(54) SEMICONDUCTOR MEMORY DEVICE

(75) Inventors: Masanori Shirahama, Shiga (JP); Yasuhiro Agata, Osaka (JP); Yasue Yamamoto, Osaka (JP)

(73) Assignee: Panasonic Corporation, Osaka (JP)

( * ) Notice: Subject to any disclaimer, the term of this patent is extended or adjusted under 35 U.S.C. 154(b) by 87 days.

(21) Appl. No.: 11/905,532

(22) Filed: Oct. 2, 2007

(65) Prior Publication Data
US 2008/0112210 A1  May 15, 2008

(30) Foreign Application Priority Data
Nov. 10, 2006  (JP)  .............................. 2006-305151

(51) Int. Cl.
*G11C 11/00* (2006.01)
(52) U.S. Cl. .................. 365/148; 365/230.06; 365/158
(58) Field of Classification Search ................ 365/148, 365/230.06, 158, 105, 171, 175
See application file for complete search history.

(56) References Cited

U.S. PATENT DOCUMENTS

| 7,092,277 | B2 | 8/2006 | Bedeschi et al. | |
|---|---|---|---|---|
| 7,394,679 | B2 * | 7/2008 | Rinerson et al. | ............ 365/148 |
| 2003/0218905 | A1 | 11/2003 | Perner et al. | |
| 2005/0195647 | A1 | 9/2005 | Perner | |

FOREIGN PATENT DOCUMENTS

JP    2005-251378    9/2005

* cited by examiner

*Primary Examiner*—David Lam
(74) *Attorney, Agent, or Firm*—McDermott Will & Emery LLP (57) ABSTRACT

A memory cell is constructed by connecting in series a variable-resistance element having a resistance which is varied by application of a positive voltage to one terminal (first node) thereof using a potential at the other terminal thereof as a reference and a diode which allows a current to flow therethrough by application of a positive voltage to the other terminal thereof using a potential at one terminal (second node) thereof as a reference. The first node is connected to the corresponding column select line and the second node is connected to the corresponding row select line. Then, to a non-selected row select line, a potential higher than when the row select line is selected is applied by using a row control circuit. By using column-select-line driver circuits, predetermined potentials corresponding to a non-selection period, a data write period, a reset period, and a data read period are applied to the column select line.

21 Claims, 7 Drawing Sheets

SEMICONDUCTOR MEMORY DEVICE

CROSS REFERENCE TO RELATED APPLICATION

The teachings of Japanese Patent Application JP 2006-305151, filed Nov. 10, 2006, are entirely incorporated herein by reference, inclusive of the specification, drawings, and claims.

BACKGROUND OF THE INVENTION

1. Field of the Invention

The present invention relates to a variable-resistance memory device using a variable-resistance device.

2. Description of the Prior Art

In recent years, as a semiconductor technology advances, devices for rewritable applications such as a flash ROM (Read Only Memory) and EEPROM (Electrically Erasable Programmable ROM) have increased in scale and degree of integration and technologically developed. In a system field using semiconductor devices, required device applications are changing. For example, there is a case where a non-volatile memory element and an OTP element are embedded in a device for security purposes, an IC tag, or the like. There is also a growing tendency toward embedding a large-capacity rewritable nonvolatile memory.

In terms of further reducing the area of a floating-gate (FG) nonvolatile memory, such as a typical flash ROM or EEPROM, recent attention has been focused on novel nonvolatile memories. The representatives thereof are numerous, including a FeRAM using a ferroelectric material, a MRAM using magnetism, a PRAM as a phase-change memory, and a variable-resistance memory.

Among these, each of memory elements in the variable-resistance memory has an oxide film using a material having a perovskite structure and a material such as a binary transition metal oxide. By increasing the resistance of the oxide film (referred to as a write or SET operation) or decreasing the resistance thereof (referred to as an erase or RESET operation), the variable-resistance memory element is caused to perform nonvolatile storage.

These variable-resistance memory elements can be disposed between metal layers in vertically and upwardly stacked relation. Therefore, a reduced area and lower cost are expected by a cross point memory cell array in three dimensions.

Biasing conditions related to the write operation and the erase operation to and from the variable-resistance memory and the relationship between biases differ from one material to another. In a majority of materials, positive and negative bipolar biases are mostly used and applied to the both ends of a resistor, but there is a material which allows the use of a unipolar bias. That is, a voltage is applied to only one of the both ends of an resistor element to enable SET/RESET operations to be performed using the potential levels thereof (see, e.g., Patent Document 1: Japanese Laid-Open Patent Publication No. 2005-251378). In the example of Patent Document 1, a feedback controlled control circuit is connected to a memory cell array to establish an equi-potential state in the memory cell array and recognize a variation in current when the selected resistive device is asserted to a reference state.

However, in the variable-resistance memory mentioned above, the potential on a word line is adjusted to be higher than that on a bit line during a selection period to implement selection, while the potential on the bit line is adjusted to be high and the potential on the word line is adjusted to be low during a non-selection period to constitute reverse biases and enhance selectivity. Accordingly, two potential adjusting mechanisms, i.e., a potential adjusting mechanism for the word lines and a potential adjusting mechanism for the bit lines are necessary. This results in the situation where the potential control intricately involves input signals such as an address signal, a data signal, and a command signal.

SUMMARY OF THE INVENTION

The present invention has been achieved in view of the problems described above and it is therefore an object of the present invention to provide a variable-resistance semiconductor memory device which allows easy control of potentials on a word line and a bit line.

To solve the foregoing problems, an embodiment of the present invention is a semiconductor memory device including: a single or plurality of memory cell arrays each having a plurality of memory cells arranged in rows and columns, a plurality of row select lines arranged to correspond to the respective rows of the plurality of memory cells and connected to the memory cells in the corresponding rows, and a plurality of column select lines arranged to correspond to the respective columns of the plurality of memory cells and connected to the memory cells in the corresponding columns; a row control circuit for controlling potentials on the respective row select lines; and a column control circuit for controlling potentials on the respective column select lines, wherein each of the memory cells has a pair of a variable-resistance element and a diode, the pair being connected in series between a first node and a second node, the first node is connected to the corresponding column select line, the second node is connected to the corresponding row select line, the column control circuit has column-select-line driver circuits each for controlling the potential on one of the column select line in one-to-one correspondence to the column select lines, and each of the column-select-line driver circuits is constructed such that corresponding potentials are applied thereto from at least four predetermined potential supply sources.

Another embodiment of the present invention is a semiconductor memory device including: a plurality of memory cell arrays each having a plurality of memory cells arranged in rows and columns, a plurality of row select lines arranged to correspond to the respective rows of the plurality of memory cells and connected to the memory cells in the corresponding rows, and a plurality of column select lines arranged to correspond to the respective columns of the plurality of memory cells and connected to the memory cells in the corresponding columns; a row control circuit for controlling potentials on the respective row select lines; and a column control circuit for controlling potentials on the respective column select lines, wherein each of the memory cells has a pair of a variable-resistance element and a diode, the pair being connected in series between a first node and a second node, the first node is connected to the corresponding column select line, the second node is connected to the corresponding row select line, and the column control circuit has column-select-line driver circuits each for controlling the potential on one of the column select line in one-to-one correspondence to the column select lines, wherein the plurality of memory cell arrays are provided in vertically stacked relation, the respective column select lines of the memory cell arrays are shared, and each of the column-select-line driver circuits is provided to correspond to one of the shared column select lines.

Still another embodiment of the present invention is a semiconductor memory device including: a plurality of memory cell arrays each having a plurality of memory cells arranged in rows and columns, a plurality of row select lines arranged to correspond to the respective rows of the plurality of memory cells and connected to the memory cells in the corresponding rows, and a plurality of column select lines arranged to correspond to the respective columns of the plurality of memory cells and connected to the memory cells in the corresponding columns; a row control circuit for controlling potentials on the respective row select lines; and a column control circuit for controlling potentials on the respective column select lines, wherein each of the memory cells has a pair of a variable-resistance element and a diode, the pair being connected in series between a first node and a second node, the first node is connected to the corresponding column select line, the second node is connected to the corresponding row select line, and the column control circuit has column-select-line driver circuits each for controlling the potential on one of the column select line in one-to-one correspondence to the column select lines, wherein the plurality of memory cell arrays are provided in vertically stacked relation, any two of the plurality of memory cell arrays which are consecutively arranged in a vertical direction share the column select lines therebetween, each of the column control circuits is provided for the two memory cell arrays sharing the column select lines therebetween, and any two of the plurality of memory cell arrays which are consecutively arranged in the vertical direction and do not share any of the column select lines therebetween share the row select lines therebetween.

DETAILED DESCRIPTION OF THE PREFERRED EMBODIMENTS

Referring to the drawings, the embodiments of the present invention will be described herein below. In the following description of the individual embodiments, a description of components having the same functions as the components that have been described once will be omitted by retaining the same reference numerals.

Embodiment 1

Figure 1:
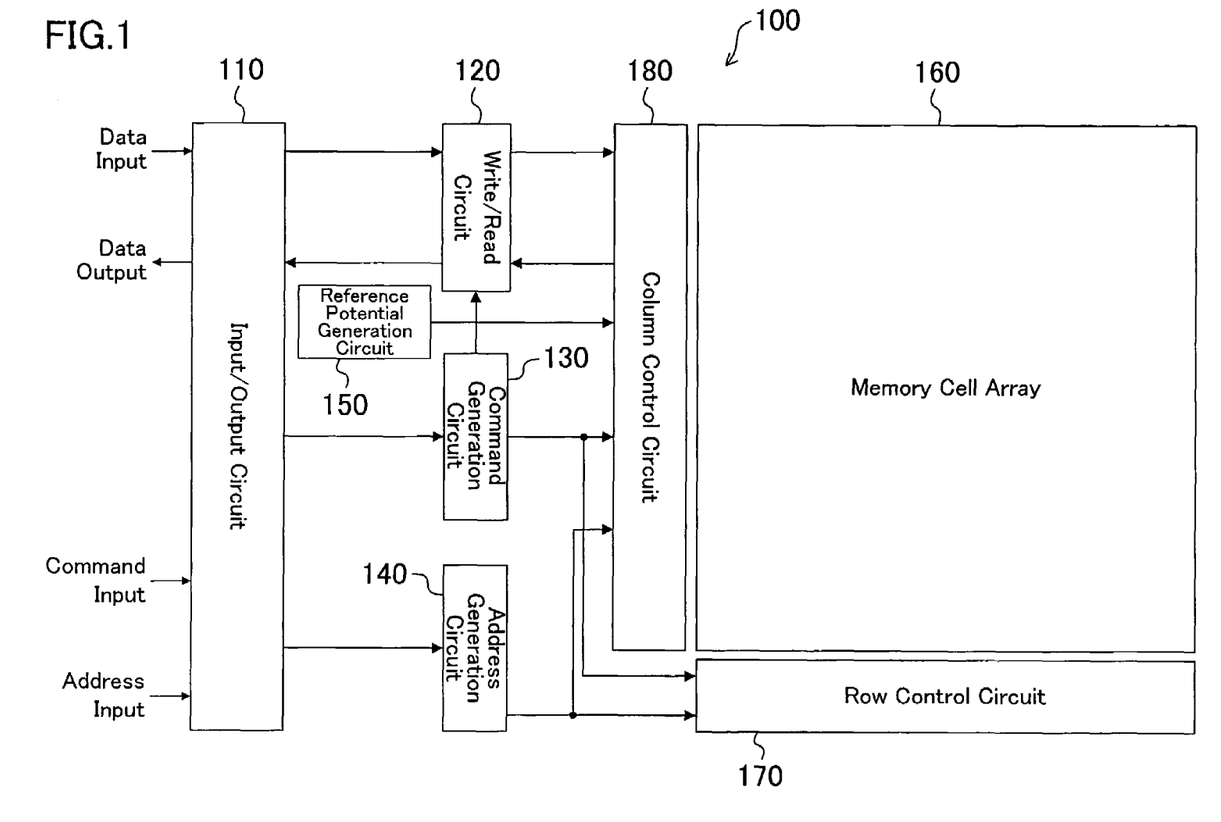
FIG. 1 is a block diagram showing a structure of a semiconductor memory device 100 according to a first embodiment of the present invention.

FIG. 1 is a block diagram showing a structure of a semiconductor memory device 100 according to the first embodiment of the present invention. As shown in FIG. 1, the semiconductor memory device 100 comprises an input/output circuit 110, a write/read circuit 120, a command generation circuit 130, an address generation circuit 140, a reference potential generation circuit 150, a memory cell array 160, a row control circuit 170, and a column control circuit 180.

The input/output circuit 110 receives data to be written, commands for write/read operations and the like, and an address signal given from the outside of the semiconductor memory device 100, and outputs read data to the outside.

The write/read circuit 120 temporarily holds the read data (a signal DataOUT described later) and the data to be written.

The command generation circuit 130 generates the commands (a signal /SET, a signal /RESET, a signal /Read, and a signal Standby described later) for read and write operations and the like based on the address signal, the data to be written, and the like each given from the outside.

An address generation circuit 140 generates an address signal for selecting a word line and an address signal for selecting a bit line based on the address signal given from the outside.

The reference potential generation circuit 150 generates a potential (reference potential) used as a reference in reading data.

Figure 2:
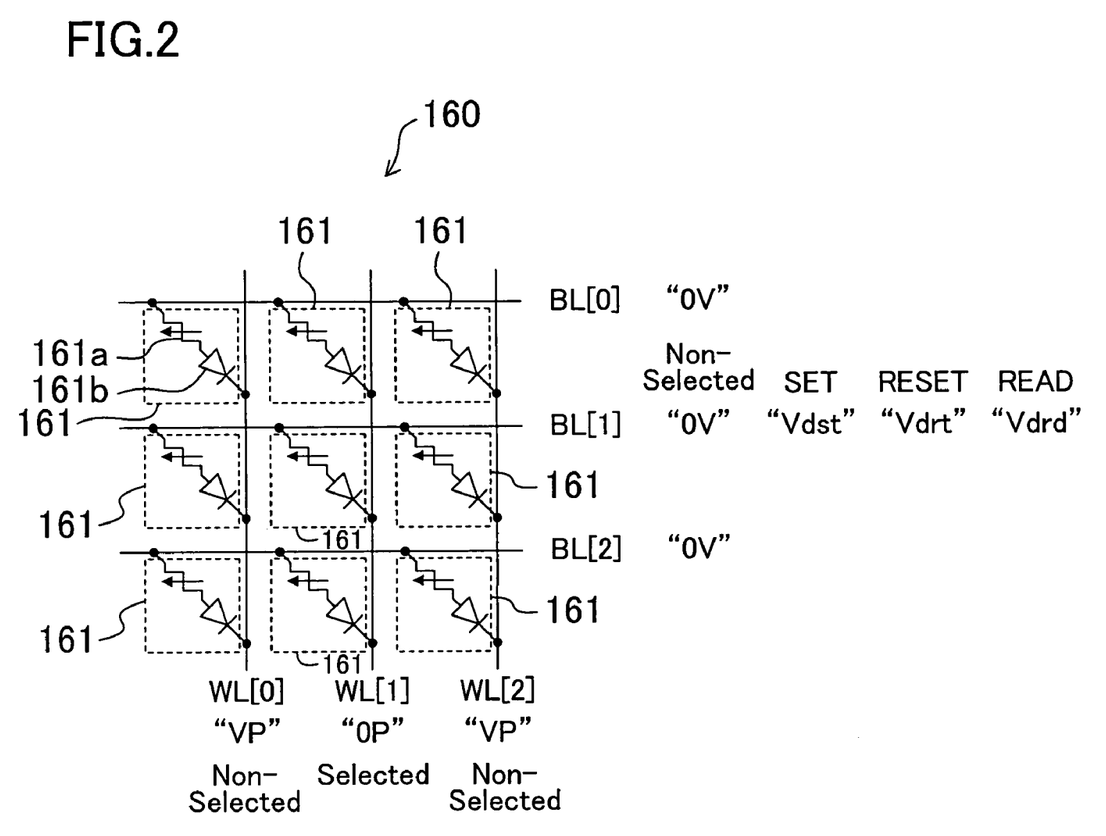
FIG. 2 shows a structure of a memory cell array 160.

As shown in FIG. 2, the memory cell array 160 comprises word lines WL[0] to WL[2], bit lines BL[0] to BL[2], and a plurality of memory cells 161.

As shown in FIG. 2, the memory cells 161 are arranged in rows and columns. The word lines WL[0] to WL[2] are arranged to correspond to the respective rows of the memory cells 161 and connected to the memory cells in the corresponding rows. The bit lines BL[0] to BL[2] are arranged to correspond to the respective columns of the memory cells 161 and connected to the memory cells 161 in the respective columns. The word lines will be also referred to as row select lines and the bit lines will be also referred to as column select lines.

Each of the memory cells 161 is constructed to allow a current to be flown from the corresponding bit line to the word line. Specifically, each of the memory cells 161 includes a pair of a variable-resistance element 161a and a diode 161b connected in series.

The variable-resistance element 161a has a resistance which is varied by application of a positive voltage to one terminal thereof (referred to as a first node) using the potential at the other terminal thereof as a reference.

The diode 161b allows a current to flow therethrough by application of a positive voltage to the other terminal thereof using the potential at one terminal thereof (referred to as a second node) as a reference.

In each of the memory cells 161, the variable-resistance element 161a has the first node connected to the corresponding bit line and the other terminal thereof connected to the diode 161b.

The diode 161b has the second node connected to the corresponding word line and the other terminal thereof connected to the variable-resistance element 161a, as mentioned above.

The memory cell array 160 thus constructed may be also referred to as a unipolar IDIR cross point memory cell array.

Figure 3:
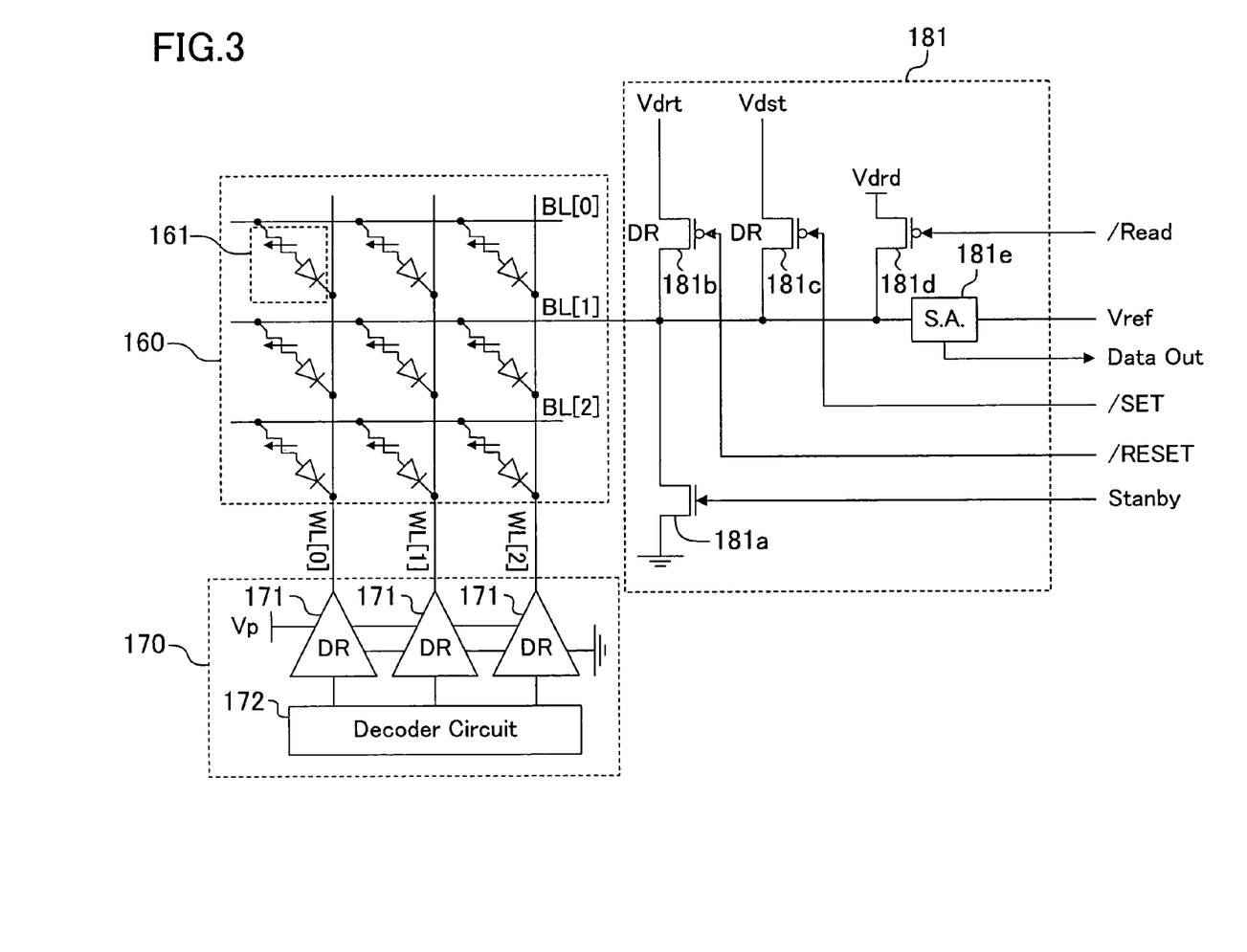
FIG. 3 shows the respective structures of the memory cell array 160, a row control circuit 170, and a column-select-line driver circuit 181.

As shown in FIG. 3, the row control circuit 170 includes row-select-line driver circuits 171 (abbreviated as DR in the drawing) which are equal in number to the word lines and a decoder circuit 172.

The row-select-line driver circuits 171 are arranged to correspond to the respective word lines in one-to-one relation. Each of the row-select-line driver circuits 171 receives a select control signal indicating whether or not the word line corresponding thereto is to be selected and controls the potential on the corresponding word line to either a standby potential Vp or a ground potential GND in response to the select control signal. Specifically, each of the row-select-line driver circuits 171 controls the potential on the corresponding word line to the ground potential GND when the word line is selected and controls the potential on the corresponding word line to the standby potential Vp when the word line is non-selected.

The decoder circuit 172 controls the operation of each of the row-select-line driver circuits 171. Specifically, the decoder circuit 172 decodes a word-line-select address signal (inputted from the address generation circuit 140) and outputs the select control signal to the selected row-select-line driver circuit 171.

The column control circuit 180 controls the potential on each of the bit lines (column select lines) and performs write and read operations (SET, RESET) with respect to the memory cell array 160. Specifically, the column control circuit 180 comprises column-select-line driver circuits 181 which are equal in number to the bit lines.

The column-select-line driver circuits 181 are arranged to correspond to the respective bit lines in one-to-one relation. Each of the column-select-line driver circuits 181 controls the potential on the bit line corresponding thereto to the ground potential GND when the bit line is non-selected, controls the potential on the corresponding bit line to a potential Vdst when the bit line is selected and a write operation is performed (during a set period), controls the potential on the corresponding bit line to a potential Vdrt when the bit line is selected and a reset operation is performed (during a reset period), and controls the potential on the corresponding bit line to a potential Vdrd when the bit line is selected and a read operation is performed (during a read period).

Specifically, each of the column-select-line driver circuits 181 includes first to fourth transistors 181a to 181d and a sense amplifier 181e, as shown in FIG. 3.

The first transistor 181a fixes the potential on the corresponding bit line to the standby potential (the ground potential GND in this example). Specifically, the signal Standby (which is on the High level during a standby period) outputted from the command generation circuit 130 is applied to the gate of the first transistor 181a. During the standby period, the gate potential of the first transistor 181a is adjusted to be equal to the higher one of the potentials Vdrt and Vdst or to the standby voltage (potential on the row select line) of the row-select-line driver circuit 171.

The second transistor 181b controls the potential on the corresponding bit line to the potential Vdrt (reset potential) during the reset period. Specifically, the signal /Reset (which is on the Low level during the reset period) is applied to the gate of the second transistor 181b during the reset period. At this time, the potential of the signal /Reset during the standby period is adjusted to be equal to the higher one of the potentials Vdrt and Vdst or to the standby voltage (potential on the row select line) of the row-select-line driver circuit 171. The signal /Reset is generated by the command generation circuit 130 based on the data and the address signal.

The third transistor 181c controls the potential on the corresponding bit line to the potential Vdst (set potential) during the set period. Specifically, the signal /SET (which is on the Low level during the set period) is applied to the gate of the third transistor 181c during the set period. At this time, the potential of the signal /SET during the standby period is the same as the standby potential during the reset period. The signal /SET is generated by the command generation circuit 130 based on the data and the address signal.

The fourth transistor 181d controls the potential on the corresponding bit line to the potential Vdst (read potential) during the read period. Specifically, the signal /Read (which is on the Low level during the read period) is applied to the gate of the fourth transistor 181d during the read period. During the standby period, the gate potential of the fourth transistor 181d is adjusted to be equal to the higher one of the potentials Vdrt and Vdst or to the standby voltage (potential on the row select line) at the row-select-line driver circuit 171. The signal /Read is generated by the command generation circuit 130 based on the read command and the address signal.

The sense amplifier 181e senses and amplifies the difference between the potential on the corresponding bit line and the reference potential and outputs the amplified potential difference as the signal DataOUT.

By thus constructing the column control circuit 180, it becomes possible to apply biases, which are the standby potential, the set potential, the reset potential, and the read potential, to each of the bit lines (column select lines).

Operation of Semiconductor Memory Device 100

Figure 4:
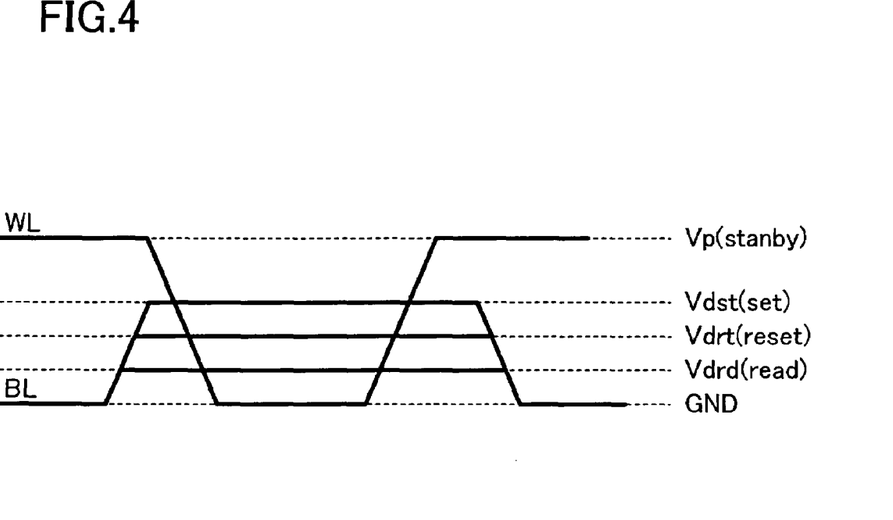
FIG. 4 is a waveform chart showing timings (bias application timings) for controlling potentials on a selected word line and a selected bit line.

In the semiconductor memory device 100, the potentials on the selected word line and the selected bit line are controlled in accordance with the respective operating states during the standby period, the set period, the reset period, and the read period. FIG. 4 is a waveform chart showing respective timings (bias application timings) for controlling the potentials on the selected word line and the selected bit line.

As shown in FIG. 4, in the semiconductor memory device 100, the potential on the bit line shifts first with an earlier operation timing to reach any of the set, reset, and read potentials (Vdst, Vdrt, and Vdrd) and then the potential on the word line is shifted to the ground potential GND as an active state potential.

When the operation is ended, the potential on the word line is conversely shifted to an inactive state and then the potential on the bit line is shifted to the inactive state. By the operation described above, it becomes possible to selectively perform the read operation and the write operation with the potential difference in a unipolar manner.

Thus, according to the present embodiment, the potential on the word line (row select line) is fixed to a low potential (e.g., the ground potential GND) when the word line is selected and the signals corresponding to the set, reset, and read commands are all implemented with the potentials applied to the bit line. In other words, the generation of the potentials on the word line (row select line) can be implemented with simple low address control and the driver circuit therefor, without depending on the commands and the data.

Since the potential on the word line (row select line) when it is non-selected is higher than the bias potentials applied to the bit line (column select line) during the data set period, the data reset period, and the data read period, the potential on the word line (row select line) when the word line is non-selected forms a complete reverse bias. As a result, the selectivity between the selected word line and the non-selected word line is improved to provide high reliability.

In addition, when the operation is initiated, the potential on the word line is shifted after the shift in the potential on the bit line is ended and, when the operation is ended, the potential on the bit line is shifted after the potential on the word line is fixed to the potential in a non-selected state, as described above. As a result, it becomes possible to prevent an unwanted erroneous application of a voltage (Disturb) and the resulting inversion between the set and reset biases during the shifts.

Embodiment 2

Figure 5:
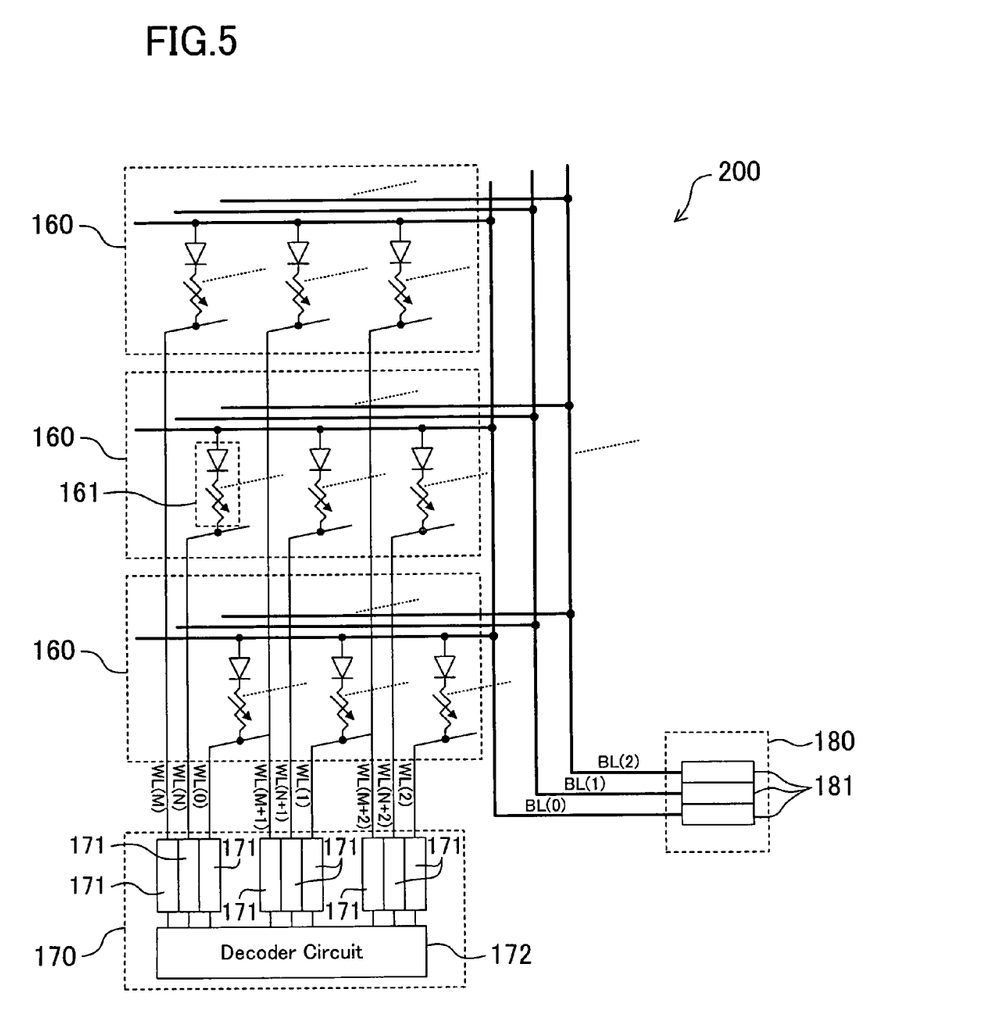
FIG. 5 is a block diagram showing a structure of a semiconductor memory device 200 according to a second embodiment of the present invention.

FIG. 5 is a block diagram showing a structure of a semiconductor memory device 200 according to the second embodiment of the present invention. As shown in FIG. 5, the semiconductor memory device 200 comprises the column control circuit 180, the row control circuit 170, and a plurality of the memory cell arrays 160.

The semiconductor memory device 200 is different from the semiconductor memory device 100 in that the memory cell arrays 160, each formed in a plane, are disposed in vertically and upwardly stacked relation to constitute a hierarchical structure (cross point memory cell array), while each of the memory cell arrays 160 retains its original structure. In the semiconductor memory device 200, the respective bit lines on the hierarchical levels are shared in a vertical direction.

Therefore, in the semiconductor memory device 200, each of the column-select-line driver circuits 181 in the column control circuit 180 controls the potential on the corresponding bit line which is shared in the vertical direction.

In the present embodiment also, the row control circuit 170 has the row-select-line driver circuits 171 which are equal in number (the total number of the word lines contained in all the memory cell arrays 160) to the word lines. The word lines in each of the memory cell arrays 160 are individually controlled by the different row-select-line driver circuits 171 (referred to as split control).

According to the present embodiment, the column-select-line driver circuits are shared in the semiconductor memory device including the cross point memory cell array having a three-dimensional structure, which is effective in reducing the area of the device.

Embodiment 3

Figure 6:
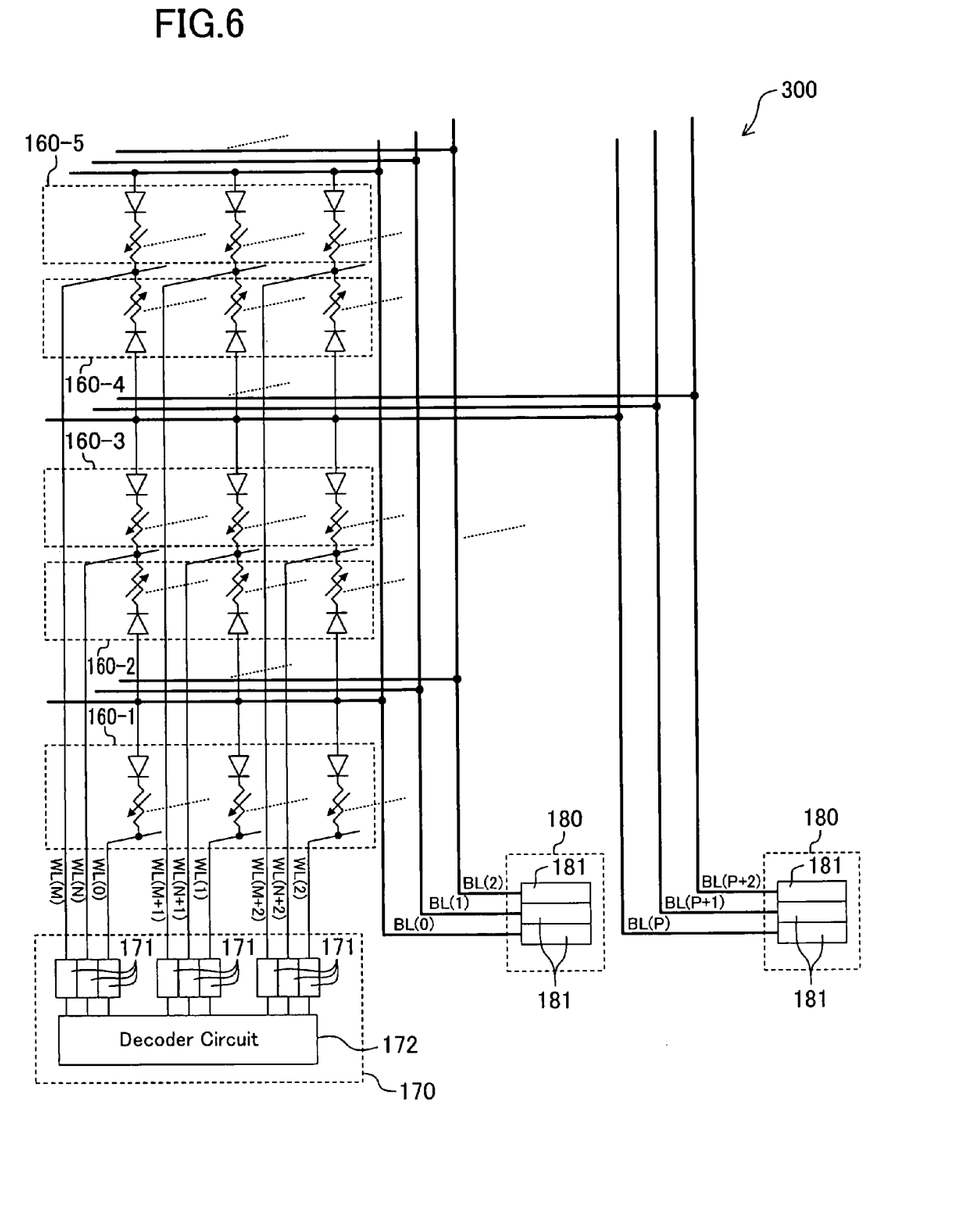
FIG. 6 is a layout diagram showing a structure of a semiconductor integrated circuit device 300 according to a third embodiment of the present invention.

FIG. 6 is a block diagram showing a structure of a semiconductor memory device 300 according to the third embodiment of the present invention. As shown in FIG. 6, the semiconductor memory device 300 comprises a plurality of the column control circuits 180, the single row control circuit 170, and the plurality of the memory cell arrays 160. The plurality of the memory cell arrays 160 are distinguished from each other with branch numbers added thereto, such as 160-1, 160-2, 160-3, 160-4, and 160-5.

In the semiconductor memory device 300 also, the memory cell arrays 160, each formed in a plane, are disposed in vertically and upwardly stacked relation to constitute a hierarchical structure (cross point memory cell array), while each of the memory cell arrays 160 retains its original structure.

In the semiconductor memory device 300, each of the bit lines is shared between two of the memory cell arrays (specifically, each metal layer is shared between the upper and lower consecutive layers). In the example of FIG. 6, the memory cell arrays 160-1 and 160-2 consecutively arranged in the vertical direction share one of the bit lines therebetween and the memory cell arrays 160-3 and 160-4 consecutively arranged in the vertical direction also share another bit line therebetween.

In addition, the word lines are also shared between two of the memory cell arrays 160 (specifically, each of the metal layers is shared between the upper and lower consecutive layers). In the example of FIG. 6, the memory cell arrays 160-2 and 160-3 share one set of the word lines therebetween and the memory cell arrays 160-4 and 160-5 share another set of the word lines therebetween.

It is to be noted that the two memory cell arrays 160 sharing the bit lines therebetween do not share any of the word lines therebetween.

The row-select-line driver circuits 171 in the row control circuit 170 are provided such that each of the row-select-line driver circuits 171 corresponds to one of the shared word lines. For example, when the word lines are shared between the two layers consecutively arranged in the vertical direction, split control is performed by individually providing the different low-select-line driver circuits 171 for the respective word lines in the upper layer.

The column control circuits 180 are provided such that each of the column control circuits 180 corresponds to one of the shared bit lines. In the example of FIG. 6, the two column control circuits 180 are provided. As a result, potentials on the respective bit lines in the upper two layers sharing one set of the word lines therebetween are individually controlled by the different column control circuits 180.

Therefore, the present invention is also effective in reducing the area of the semiconductor memory device including the cross point memory cell array having the three-dimensional structure.

During the operation of the semiconductor memory device 300, the address signal is decoded to selectively operate either one of the column control circuits 180. Since the column control circuit 180 can be selected with the address signal, easy control is performed.

Embodiment 4

Figure 7:
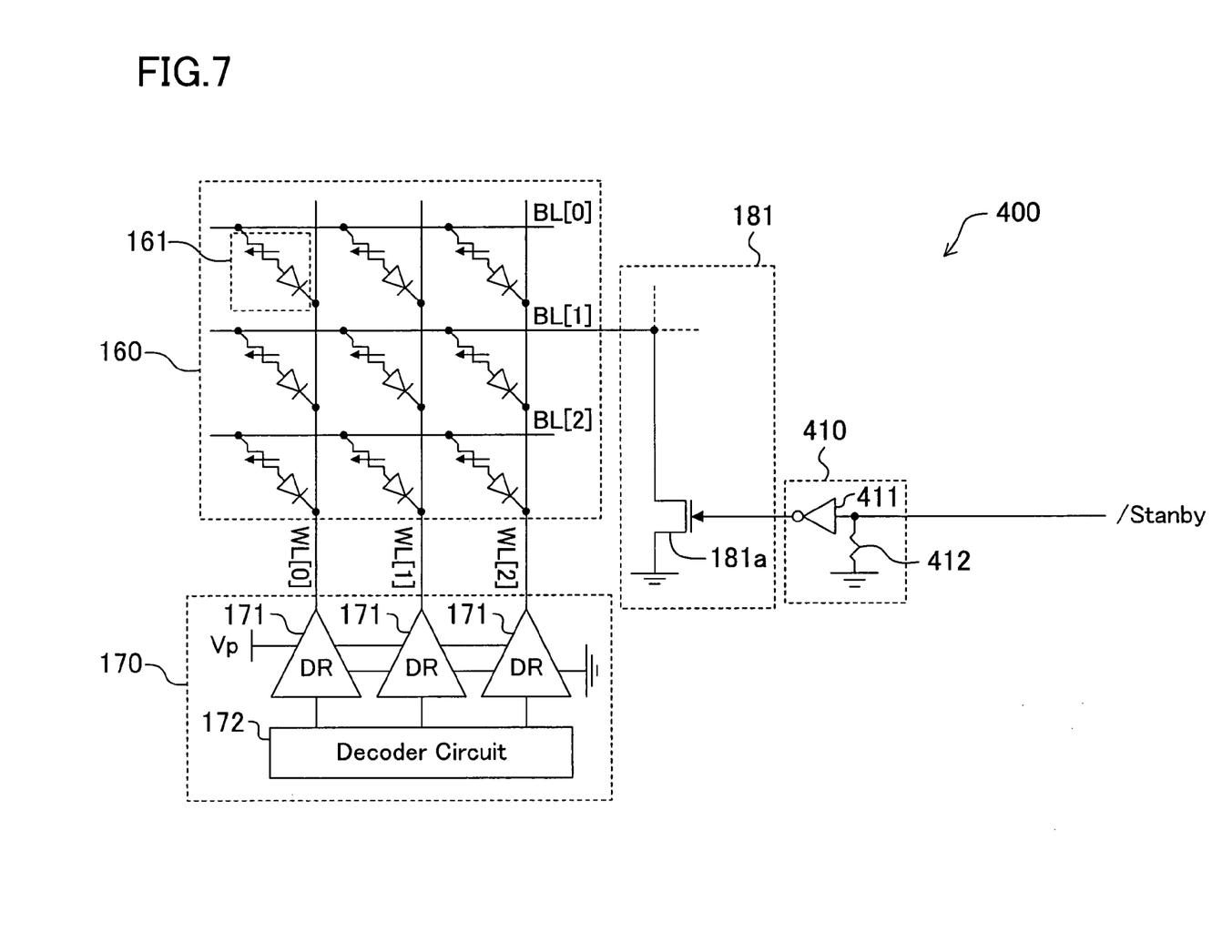
FIG. 7 is a block diagram showing a structure of a semiconductor integrated circuit device 400 according to a fourth embodiment of the present invention.

FIG. 7 is a block diagram showing a structure of a semiconductor memory device 400 according to the fourth embodiment of the present invention. The semiconductor memory device 400 is an embodiment of means for fixing the potential on each of the column select lines (bit lines) to the standby potential when the semiconductor memory device is turned on. As shown in FIG. 7, the semiconductor memory device 400 is constructed by adding a standby potential control circuit 410 to the semiconductor memory device 100 such that a signal /Standby (inverted signal of the signal Standby) is inputted thereto, instead of the signal Standby for fixing the bit line to a standby state. In FIG. 7, the depiction of the components of the column-select-line driver circuit 181 other than the first transistor 181a is omitted.

The standby potential control circuit 410 includes an inverter 411 and a resistor 412.

The inverter 411 has the signal /Standby as an input, while having an output connected to the gate of the first transistor 181a. The resistor 412 has a high resistance value for pulling down (Pulldown) the potential at the input-side terminal of the inverter 411 to the ground potential GND.

Due to the structure shown above, the standby state is inevitably achieved when the semiconductor memory device is turned on and, even when the potential on any of the word lines varies, a sufficient bias to cause a change in the resistance of the variable-resistance element 161a is not applied.

As a result, it becomes possible to suppress an unexpected misoperation such as a change erroneously caused in the resistance of the memory element when power supply restoration and activation are performed by turning on the semiconductor memory device or a surge test such as ESD, while a predetermined resistance value is held.

In each of the embodiments described above, it is preferable that the potential on each of the row select lines during the standby period is equal to any of the potentials of a power source for IO signals (such as data to be written, the commands for read/write operations, the address signal, and the read data) supplied into the semiconductor memory device, the potential of an analog power source, and the potential of a logic power source or, alternatively, a shared power supply is used. This allows the transistors in the semiconductor memory device to be composed of transistors occupying a small area and used at low potentials without using a boosted power supply potential. In addition, an extra power source terminal is unneeded. For example, a write operation using a transistor power source for IO signals and a read operation using an internal core power source can be performed.

Preferably, the memory cell array 160 is composed of the uppermost metal wiring layer. In a typical system LSI, the design rules used for the uppermost metal layer and the immediately underlying layer are not the finest. Rougher design rules are used therefor and the metal layers are also thick. As a result, current properties during set/reset operations are extremely excellent. In addition, it becomes also possible to construct the memory cell elements even when they do not conform to the latest and finest design rules.

The numbers of the memory cells, the bit lines, and the word lines are only illustrative, and are not limited to the examples in the embodiments described above.

Thus, the semiconductor memory device according to the present invention has the effect of allowing easy control of the potentials on the word lines and the bit lines and is therefore useful as a variable-resistance memory using a variable-resistance device or the like.

The invention claimed is:

1. A semiconductor memory device comprising:
a single or plurality of memory cell arrays each having a plurality of memory cells arranged in rows and columns, a plurality of row select lines arranged to correspond to the respective rows of the plurality of memory cells and connected to the memory cells in the corresponding rows, and a plurality of column select lines arranged to correspond to the respective columns of the plurality of memory cells and connected to the memory cells in the corresponding columns;
a row control circuit for controlling potentials on the respective row select lines; and
a column control circuit for controlling potentials on the respective column select lines, wherein
each of the memory cells has a pair of a variable-resistance element and a diode, the pair being connected in series between a first node and a second node,
the first node is connected to the corresponding column select line,
the second node is connected to the corresponding row select line,
the column control circuit has column-select-line driver circuits each for controlling the potential on one of the column select line in one-to-one correspondence to the column select lines, and
each of the column-select-line driver circuits is constructed such that corresponding potentials are applied thereto from at least four predetermined potential supply sources.

2. The semiconductor memory device of claim 1, wherein each of the column-select-line driver circuits has first to fourth transistors, and
the first to fourth transistors have respective one terminals connected to the potential supply sources and have the respective other terminals connected to the column select lines.

3. The semiconductor memory device of claim 1, wherein each of the column-select-line driver circuits is constructed such that the corresponding potentials are applied thereto from the four predetermined potential supply sources respectively in association with a non-selection period, a data write period, a reset period, and a data read period.

4. The semiconductor memory device of claim 3, wherein the potentials from the four predetermined potential supply sources are different from each other.

5. The semiconductor memory device of claim 1, wherein the row control circuit applies a higher potential to each of the non-selected row select lines than when the row select line is selected.

6. The semiconductor memory device of claim 5, wherein the potential applied to the non-selected row select line is higher than a potential applied to each of the column select lines during a data write period, a potential applied to the column select line during a reset period, and a potential applied to the column select line during a data read period.

7. The semiconductor memory device of claim 5, wherein each of the column-select-line driver circuits has a first transistor for applying a standby potential to the corresponding column select line, a second transistor for applying a read potential thereto, a third transistor for applying a write potential thereto, and a fourth transistor for applying a reset potential thereto, and
a gate potential of each of the first transistor, the second transistor, the third transistor, and the fourth transistor during a standby period is either of the higher one of a potential applied during a data write period and a potential applied during a reset period or the potential on each of the row select lines during the standby period.

8. The semiconductor memory device of claim 1, wherein, during a data write period, a reset period, and a data read period, the row control circuit initiates a shift in the potential on each of the row select lines to fix the potential on the row select line after the potential on the selected column select line is fixed.

9. The semiconductor memory device of claim 1, wherein, during a data write period, a reset period, and a data read period, each of the column-select-line driver circuits shifts the potential on the column select line to a value in an inactive state after the potential on the corresponding row select line is fixed to the value in the inactive state.

10. The semiconductor memory device of claim 1, wherein a plurality of the memory cell arrays are provided in vertically stacked relation,
the respective column select lines of the memory cell arrays are shared, and
each of the column-select-line driver circuits is provided to correspond to one of the shared column select lines.

11. The semiconductor memory device of claim 1, wherein a plurality of the memory cell arrays are provided in vertically stacked relation,
any two of the plurality of memory cell arrays which are consecutively arranged in a vertical direction share one of the column select lines therebetween,
each of the column-select-line driver circuits is provided to correspond to the two memory cell arrays sharing the column select lines therebetween, and
any two of the plurality of memory cell arrays which are consecutively arranged in the vertical direction and do not share any of the column select lines therebetween share the row select lines therebetween.

12. The semiconductor memory device of claim 11, wherein
a plurality of pairs of the memory cell arrays share the column select lines therebetween and
the column control circuit corresponding to any of the pairs is selected with an address signal.

13. The semiconductor memory device of claim 1, wherein the potential on each of the row select lines during a standby period is equal to any of a potential of a power source for an IO signal supplied into the semiconductor memory device, a potential of an analog power source, and a potential of a logic power source, or is used in common.

14. The semiconductor memory device of claim 1, further comprising:
a standby potential control circuit for fixing the potential on each of the column select lines to a standby potential when the semiconductor memory device is turned on.

15. The semiconductor memory device of claim 1, wherein the memory cell array is composed only of two uppermost metal wiring layers.

16. The semiconductor memory device of claim 1, wherein
the variable-resistance element has a resistance which is varied by application of a positive voltage to the first node, which is a terminal unconnected to the diode, using a potential at the other terminal thereof as a reference and
the diode allows a current to flow therethrough by application of a positive voltage to the other terminal thereof using a potential at the second node, which is a terminal unconnected to the variable-resistance element, as a reference.

17. A semiconductor memory device comprising:
a plurality of memory cell arrays each having a plurality of memory cells arranged in rows and columns, a plurality of row select lines arranged to correspond to the respective rows of the plurality of memory cells and connected to the memory cells in the corresponding rows, and a plurality of column select lines arranged to correspond to the respective columns of the plurality of memory cells and connected to the memory cells in the corresponding columns;
a row control circuit for controlling potentials on the respective row select lines; and
a column control circuit for controlling potentials on the respective column select lines, wherein
each of the memory cells has a pair of a variable-resistance element and a diode, the pair being connected in series between a first node and a second node,
the first node is connected to the corresponding column select line,
the second node is connected to the corresponding row select line, and
the column control circuit has column-select-line driver circuits each for controlling the potential on one of the column select line in one-to-one correspondence to the column select lines, wherein
the plurality of memory cell arrays are provided in vertically stacked relation,
the respective column select lines of the memory cell arrays are shared, and
each of the column-select-line driver circuits is provided to correspond to one of the shared column select lines.

18. The semiconductor memory device of claim 7, wherein
the variable-resistance element has a resistance which is varied by application of a positive voltage to the first node, which is a terminal unconnected to the diode, using a potential at the other terminal thereof as a reference and
the diode allows a current to flow therethrough by application of a positive voltage to the other terminal thereof using a potential at the second node, which is a terminal unconnected to the variable-resistance element, as a reference.

19. A semiconductor memory device comprising:
a plurality of memory cell arrays each having a plurality of memory cells arranged in rows and columns, a plurality of row select lines arranged to correspond to the respective rows of the plurality of memory cells and connected to the memory cells in the corresponding rows, and a plurality of column select lines arranged to correspond to the respective columns of the plurality of memory cells and connected to the memory cells in the corresponding columns;
a row control circuit for controlling potentials on the respective row select lines; and
a column control circuit for controlling potentials on the respective column select lines, wherein
each of the memory cells has a pair of a variable-resistance element and a diode, the pair being connected in series between a first node and a second node,
the first node is connected to the corresponding column select line,
the second node is connected to the corresponding row select line, and
the column control circuit has column-select-line driver circuits each for controlling the potential on one of the column select line in one-to-one correspondence to the column select lines, wherein
the plurality of memory cell arrays are provided in vertically stacked relation,
any two of the plurality of memory cell arrays which are consecutively arranged in a vertical direction share the column select lines therebetween,
each of the column control circuits is provided for the two memory cell arrays sharing the column select lines therebetween, and
any two of the plurality of memory cell arrays which are consecutively arranged in the vertical direction and do not share any of the column select lines therebetween share the row select lines therebetween.

20. The semiconductor memory device of claim 19, wherein
a plurality of pairs of the memory cell arrays share the column select lines therebetween and
the column control circuit corresponding to any of the pairs is selected with an address signal.

21. The semiconductor memory device of claim 19, wherein
the variable-resistance element has a resistance which is varied by application of a positive voltage to the first node, which is a terminal unconnected to the diode, using a potential at the other terminal thereof as a reference and
the diode allows a current to flow therethrough by application of a positive voltage to the other terminal thereof using a potential at the second node, which is a terminal unconnected to the variable-resistance element, as a reference.

* * * * *